United States Patent [19]

Barron et al.

[11] Patent Number: 5,357,567
[45] Date of Patent: Oct. 18, 1994

[54] METHOD AND APPARATUS FOR VOLUME SWITCHED GAIN CONTROL

[75] Inventors: David L. Barron, Scottsdale; James A. Stephens, Chandler; William C. Yip, Scottsdale, all of Ariz.

[73] Assignee: Motorola, Inc., Schaumburg, Ill.

[21] Appl. No.: 930,254

[22] Filed: Aug. 14, 1992

[51] Int. Cl.⁵ ............................................. H04M 1/00
[52] U.S. Cl. ..................... 379/390; 379/389; 379/406; 379/407; 379/409
[58] Field of Search ............ 379/388, 392, 391, 410, 379/411, 389, 407, 406, 409, 390

[56] References Cited

U.S. PATENT DOCUMENTS

| | | | |
|---|---|---|---|
| 3,860,756 | 1/1975 | Shinoi et al. | 179/1 HF |
| 4,220,819 | 9/1980 | Atal | 179/1 |
| 4,346,261 | 8/1982 | Hestad et al. | 179/1 HF |
| 4,507,524 | 3/1985 | Yun | 179/81 B |
| 4,629,829 | 12/1986 | Puhl et al. | 379/58 |
| 4,677,671 | 6/1987 | Galand | 381/31 |
| 4,715,063 | 12/1987 | Haddad et al. | 379/390 |
| 4,741,018 | 4/1988 | Potratz et al. | 379/58 |
| 4,791,670 | 12/1988 | Venaria et al. | 381/41 |
| 4,811,390 | 3/1989 | Garabadian et al. | 379/390 |
| 4,817,157 | 3/1989 | Gerson | 381/40 |
| 4,843,621 | 6/1989 | Potratz | 379/58 |
| 4,852,179 | 7/1989 | Fette | 381/29 |
| 4,879,745 | 11/1989 | Arbel | 379/389 |
| 4,896,361 | 1/1990 | Gerson | 381/40 |
| 4,899,385 | 2/1990 | Ketchum et al. | 381/36 |
| 4,910,781 | 3/1990 | Ketchum et al. | 381/36 |
| 4,965,822 | 10/1990 | Williams | 379/390 |
| 5,021,783 | 6/1991 | Hendrickson et al. | 379/391 |
| 5,075,687 | 12/1991 | Chen et al. | 379/409 |
| 5,212,722 | 5/1993 | Murata | 379/409 |

OTHER PUBLICATIONS

A publication entitled "General Purpose Voice Coding Module", published by Motorola GEG, Scottsdale, AZ, Apr., 1991.

Primary Examiner—James L. Dwyer
Assistant Examiner—J. M. Saint-Surin
Attorney, Agent, or Firm—Frederick M. Fliegel

[57] ABSTRACT

An apparatus comprises a first and a second input and a processor coupled to the inputs. The processor estimates peak and minimum levels of each of the first and second input signals. A first signal regulator is coupled to the first input and to a first output for delivering a first output signal from the first signals. A second signal regulator is coupled to the second input and to a second output for delivering a second output signal from the second audio signals. A gain adjustment device is coupled to the processor and the first and second signal regulators. The gain adjustment device provides control signals to the first and second signal regulators to adjust an output signal level of the first output signal in response to minimum and peak levels of the first and second input signals. The output signal level is continuously variable over a range.

20 Claims, 6 Drawing Sheets

METHOD AND APPARATUS FOR VOLUME SWITCHED GAIN CONTROL

FIELD OF THE INVENTION

This invention relates in general to the field of communications, in particular to telephone communications and more particularly to speakerphone communications.

BACKGROUND OF THE INVENTION

A voice broadcasting system which includes gain requires some means for preventing feedback from output to input in order to avoid unwanted echoes and/or oscillation. Conventional telephones achieve this by placing the speaker and microphone such that they are acoustically de-coupled from one another. As such, conventional telephones operate in the "full duplex" mode, i.e., both parties may speak at once and if both parties do speak at once, each party may hear what the other party is saying.

Speakerphones cannot acoustically de-couple the microphone and the speaker from one another. It is thus desirable operate speakerphones in the half-duplex mode, i.e., to switch the speakerphone from transmit mode to receive mode such that the speakerphone is either transmitting or receiving, but not both, at any one time. This is often accomplished by a voice-operated switch or VOX. Operation of such switches sometimes provides a "choppy" sound to the conversation by switching with inappropriate frequency or in response to background noise.

What are needed are methods and apparatus for providing hands-free conversation capabilities for speakerphones which operate well despite presence of background noise and which switch smoothly from transmit to receive and vice-versa in response to speech signals.

SUMMARY OF THE INVENTION

Accordingly, there is provided a new and improved apparatus comprising first and second inputs and a processor coupled to the inputs. The processor estimates peak and minimum levels of each of the first and second input signals. A first signal regulator is coupled to the first input and to a first output for delivering a first output signal from the first signals. A second signal regulator is coupled to the second input and to a second output for delivering a second output signal from the second input signals. A gain adjustment device is coupled to the processor and to the first and second signal regulators. The gain adjustment device provides control signals to the first and second signal regulators to adjust an output signal level of the first output signal in response to minimum and peak levels of the first and second input signals. The output signal level is continuously variable over a range.

In a preferred embodiment the apparatus comprises a digital signal processor for realizing the first and second signal regulators and the gain adjustment device.

The digital signal processor is desirably realized including a DSP 56001 digital signal processing integrated circuit.

The present invention further provides a method for adjusting a signal level. The method comprises the steps of providing first and second input signals and characterizing the first and second input signals to determine first and second minimum signal levels and to determine first and second peak signal levels. The method further comprises steps of processing the first and second minimum signal levels and the first and second peak signal levels to provide first and second control signals, adjusting a first output signal level in accordance with the first control signal and adjusting a second output signal level in accordance with the second control signal.

The method desirably but not essentially includes filtering the first and second input signals to eliminate low frequency signals and to eliminate signals exceeding a sampling rate of a processor.

The characterizing step of the method further desirably but not essentially includes the steps of measuring a first peak signal level of the first input signal over a first time interval, measuring a first minimum signal level of the first input signal over a second time interval, measuring a first peak signal level of the second input signal over the first time interval and measuring a first minimum signal level of the second input signal over the second time interval.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Speakerphones for use with radio and landline communications systems and the like are described in U.S. Pat. No. 4,629,829; 3,860,756; 4,507,524; 4,346,261; 4,715,063; 4,741,018; 4,811,390; 4,843,621; and 4,879,745, which are incorporated herein by reference.

Figure 1:
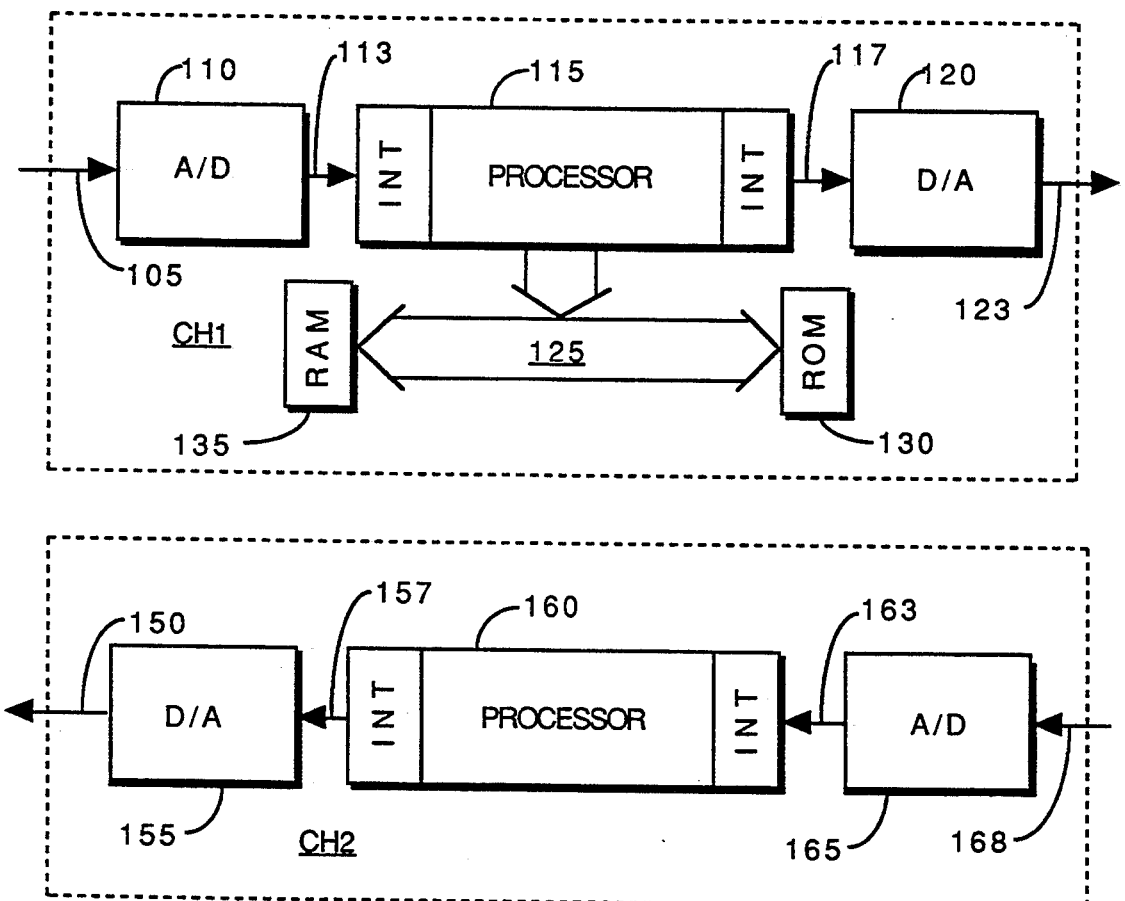
FIG. 1 is a simplified block diagram of a digital audio signal processor in accordance with the present invention.

FIG. 1 is a simplified block diagram of digital audio signal processor 101 in accordance with the present invention. Digital audio signal processor 101 comprises first channel CH1 and second channel CH2.

First channel CH1 comprises input 105 coupled to analog-to-digital (A/D) converter 110 including antialiasing filters. By way of example, input 105 may comprise an audio input from a microphone. A/D converter 110 is coupled to processor 115 via lead 113. Processor 115 is coupled via lead 117 to digital-to-analog (D/A) converter 120 having output 123 and including reconstruction filters. Processor 115 has interface circuits INT allowing serial data communications with external apparatus (e.g., A/D 110, D/A 120). By way of example, output 123 may comprise an audio output to a conventional telephone system. Anti-aliasing filters and reconstruction filters are well known in the art as filters which are necessary for interfacing discrete time systems to analog environments.

Processor 115 is coupled via digital bus 125 to external circuitry such as random access memory (RAM) 135 and read only memory (ROM) 130, clocking circuitry (not shown), power supply circuitry (not shown) and other ancillary circuitry as appropriate and as is well known in the art.

Second channel CH2 comprises input 168 coupled to A/D converter 165. By way of example, input 168 may comprise an audio input from a telephone line. A/D converter 165 is coupled to processor 160 via lead 163. Processor 160 is coupled via lead 157 to D/A converter 155 having output 150. By way of example, output 150 may comprise an audio output to a conventional speaker. Processor 160 is also coupled via a digital bus (not shown) to memory circuits (not shown) and other ancillary circuitry in a fashion similar to that described above for processor 115.

Alternatively, the roles of CH1 and CH2 may be interchanged, i.e., input 105 may correspond to a telephone line, with output 123 corresponding to a speaker, while input 168 corresponds to a microphone and output 150 corresponds to a telephone line.

Figure 2:
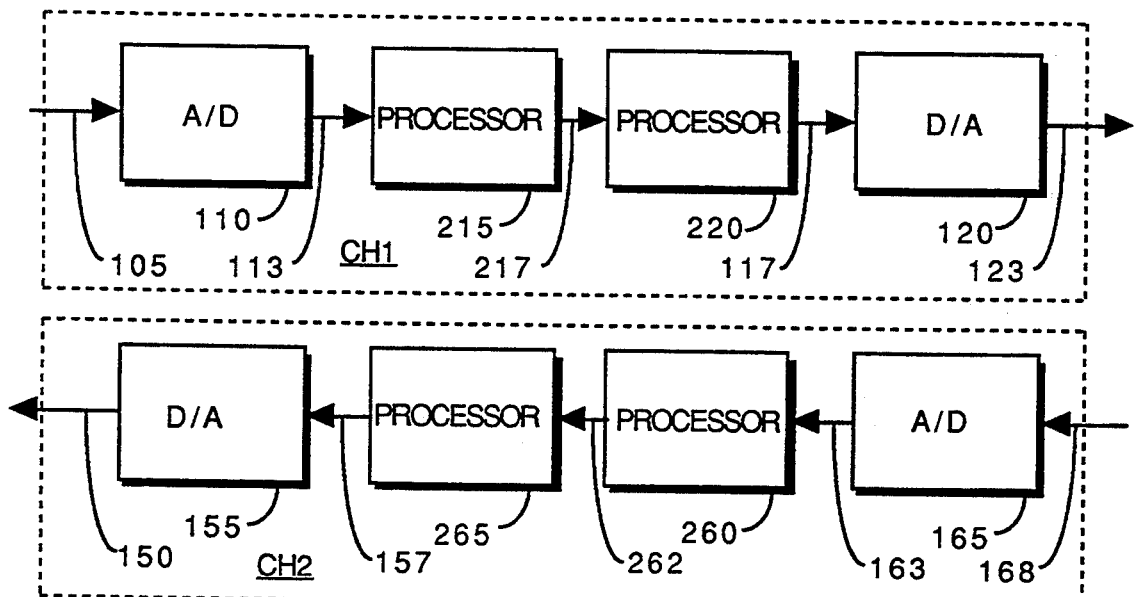
FIG. 2 is a simplified block diagram of a particular embodiment of a digital audio signal processor in accordance with the present invention.

FIG. 2 is a simplified block diagram of a particular embodiment of digital audio signal processor 201 in accordance with the present invention. Digital audio signal processor 201 comprises first channel CH1 and second channel CH2.

First channel CH1 comprises input 105 coupled to A/D converter 110. A/D converter 110 is coupled to processor 215 via lead 113 and to processor 220 via lead 217. Lead 117 couples processor 220 to D/A converter 120 having audio output lead 123.

Second channel CH2 comprises input 168 coupled to A/D converter 165. A/D converter 165 is coupled to processor 260 via lead 163. Processor 260 is coupled to processor 265 via interconnection 262. Lead 157 couples processor 265 to D/A 155 having output 150.

Processors 215, 220, 260 and 265 are similar to processors 115 and 160 of FIG. 1, having digital busses (not shown) analogous to digital bus 125 of FIG. 1 coupled to external circuitry (not shown) such as RAM 135 and ROM 130 of FIG. 1 and having interface circuitry for coupling to A/D, D/A circuitry and/or other processors. Processors 215, 220, 260, 265 of FIG. 2 and 115 and 160 of FIG. 1 may comprise vocoders, i.e., speech analysis and synthesis devices for converting between analog speech and a digital representation of analog speech.

Vocoders are well known in the art and as is described in, for example, U. S. Pat. Nos. 4,220,819; 4,677,671; 4,791,670; 4,817,157; 4,852,179; 4,896,361; 4,899,385 and 4,910,781; which are incorporated herein by reference. Another example is described in "General Purpose Voice Coding Module", describing a vocoder module (Part No. 01-P36780D001) capable of operating in a variety of vocoding modes (2400 bps LPC10, 4800 bps CELP, 9600 bps MRELP and 16000 bps CVSD) and which is available from Motorola, Inc. of Scottsdale, Ariz.

Figure 3:
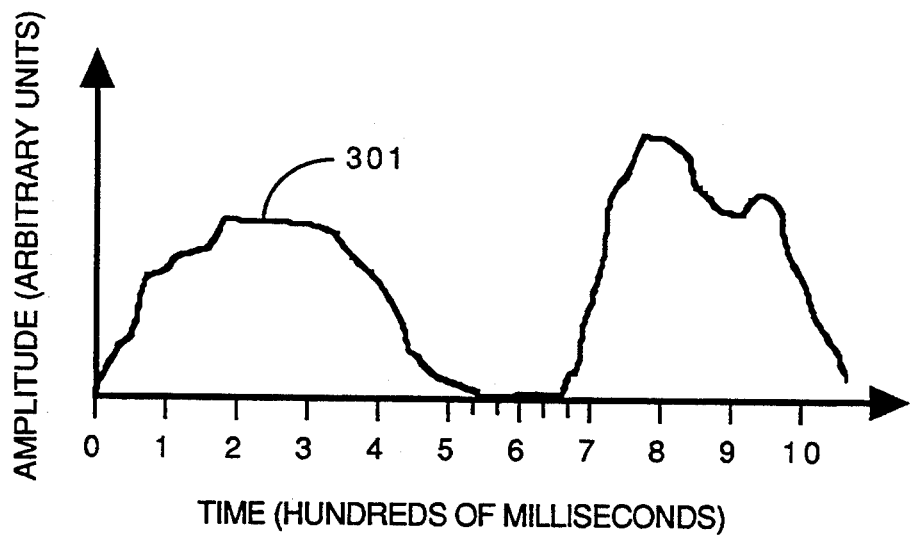
FIG. 3 is a representative graph of speech amplitude versus time.

FIG. 3 is a representative graph of speech amplitude 301 versus time. Speech amplitude 301 provides a generic example of human speech by illustrating several times (i.e., roughly 0.01 to 0.5 and 0.69 to greater than one second) during which substantial speech energy is present, separated by a relatively quiet interval extending from about 0.5 to about 0.68 seconds. Typically, speech comprises about 80% enunciations and about 20% pauses. Pauses tend to be at least 50 to 100 milliseconds in length and it is reasonable to expect several pauses per second.

Longer and shorter periods of substantial energy and of relative quiet also occur during speech and other types of audio signal transmissions. It is desirable to form estimates of the peak speech energy or amplitude which estimates rise quickly with increasing speech amplitude and decay relatively more slowly than speech amplitude in order to (1) determine when an audio signal is occurring and (2) to avoid "clipping"portions of speech which immediately follow normal pauses such as those separating syllables, words and sentences.

Similarly, it is useful to determine a representative background signal level to account for differences in ambient noise, which may be quite high (e.g., a factory manufacturing area or an office area) in some cases while a much lower ambient noise level may prevail in other cases.

Determining a representative ambient noise level at at least one end enables appropriate switching from listen to talk mode and reduces the probability of, for example, maintaining the talk mode in response to a high ambient noise level or, alternatively, switching to listen mode while relatively quiet speech is occurring.

Figure 4:
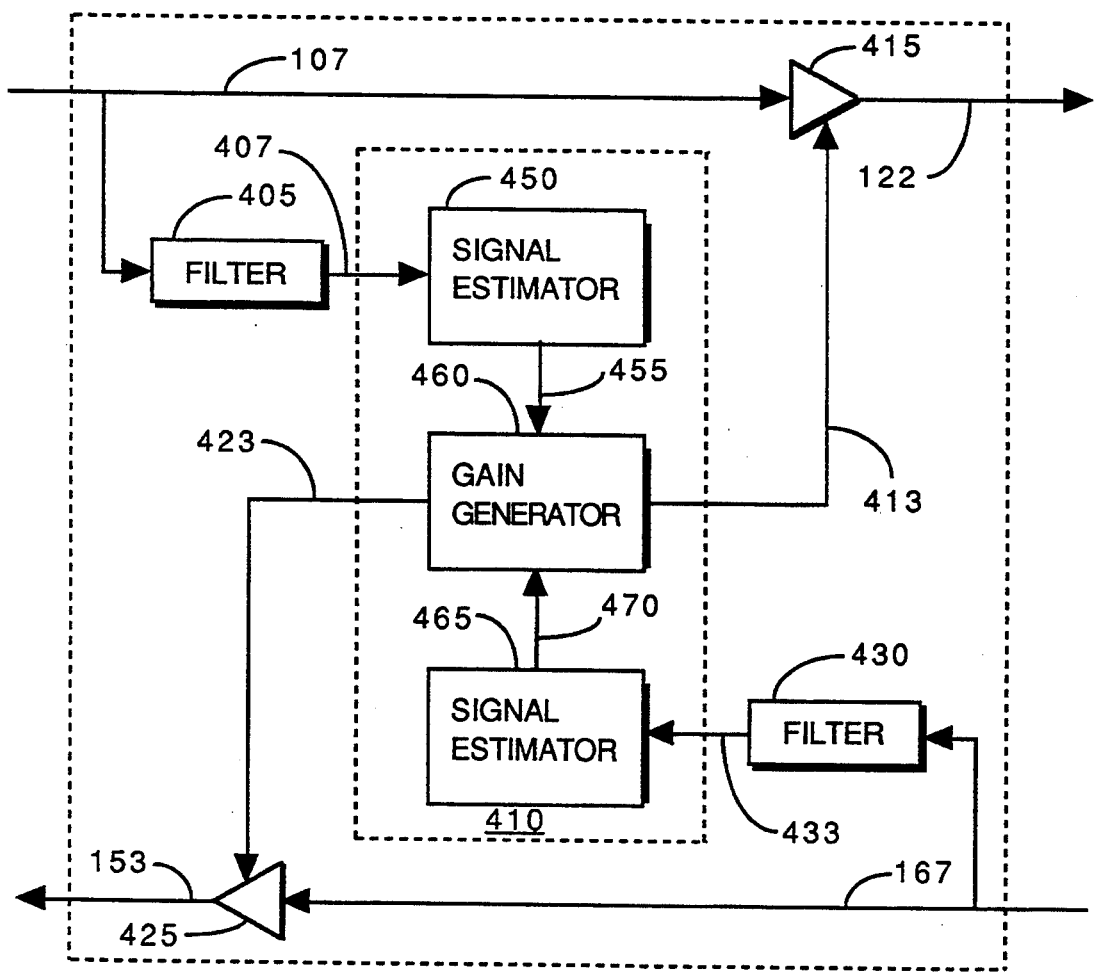
FIG. 4 is a simplified block diagram of a gain switching technique in accordance with the present invention.

FIG. 4 is a simplified block diagram of gain switching technique 401 in accordance with the present invention. Technique 401 requires first and second audio inputs 107 and 167, each coupled to filters 405 and 430, respectively, and also to variable gain blocks 415 and 425, respectively.

Variable gain blocks 415 and 425 have outputs 122 and 153, respectively. Variable gain blocks 415 and 425 are coupled to gain generator 460 via interconnections 413 and 423, respectively.

Gain generator 460 is also coupled to signal estimators 450 and 465 by interconnections 455 and 470, respectively, and collectively comprise gain control module 410.

Signal estimators 450 and 465 are also coupled to filters 405 and 430 by interconnections 407 and 433, respectively.

Input 107 corresponds, for example, to inputs 105 of FIGS. 1 and 2. Input 167 corresponds, for example, to inputs 168 of FIGS. 1 and 2, while output 122 corresponds, for example, to outputs 123 and output 153 corresponds, for example, to outputs 150 of FIGS. 1 and 2.

In operation, an input signal present at input 107, for example, is filtered by filter 405 and a resulting filtered signal is coupled via interconnection 407 to, and analyzed by, signal estimator 450.

Signal estimator 450 provides indicia (e.g., estimates of peak and/or average signal levels occurring during a prescribed interval and minimum signal levels occurring over the same or a different interval within another prescribed interval) to gain generator 460 via interconnection 455.

Similar data characterizing signals from input 167 are delivered to gain generator 460 via interconnections 433, 470, filter 430 and signal estimator 465. Gain generator 460 determines how gains of variable gain blocks 415, 425 should vary in order to allow either the signal associated with input 107 or the signal associated with input 167 to dominate and so to be passed to outputs 122 and/or 153.

The functions of technique 401 may be realized in any of several fashions. For example, variable gain blocks 415, 425 may be voltage-controlled operational amplifiers wherein amplifier gains are set by magnitudes of voltages applied to control inputs 413 and 423.

Filters 405 and 430 may be realized in any of a number of fashions; R-L-C networks, active R-C techniques and simple R-C circuits, as are well known in the art, for example. Similarly, signal estimators 450, 465 and gain generator 460 may be realized as analog circuits (discussed infra, FIG. 7).

Alternatively, the functions of technique 401 may be realized through software, for example in processors 115, 160 of FIG. 1 or in processors 215, 220 and 260, 265 of FIG. 2. In this approach, the functions of filters 405, 430 may be realized in A/D converters 110, 165 of FIGS. 1 and 2, or may be realized in software or in a combination of the two. Discussion of a software technique for realizing many of the functions of technique 401 follows in connection with FIGS. 5 and 6 (infra).

Figures 5, 6:
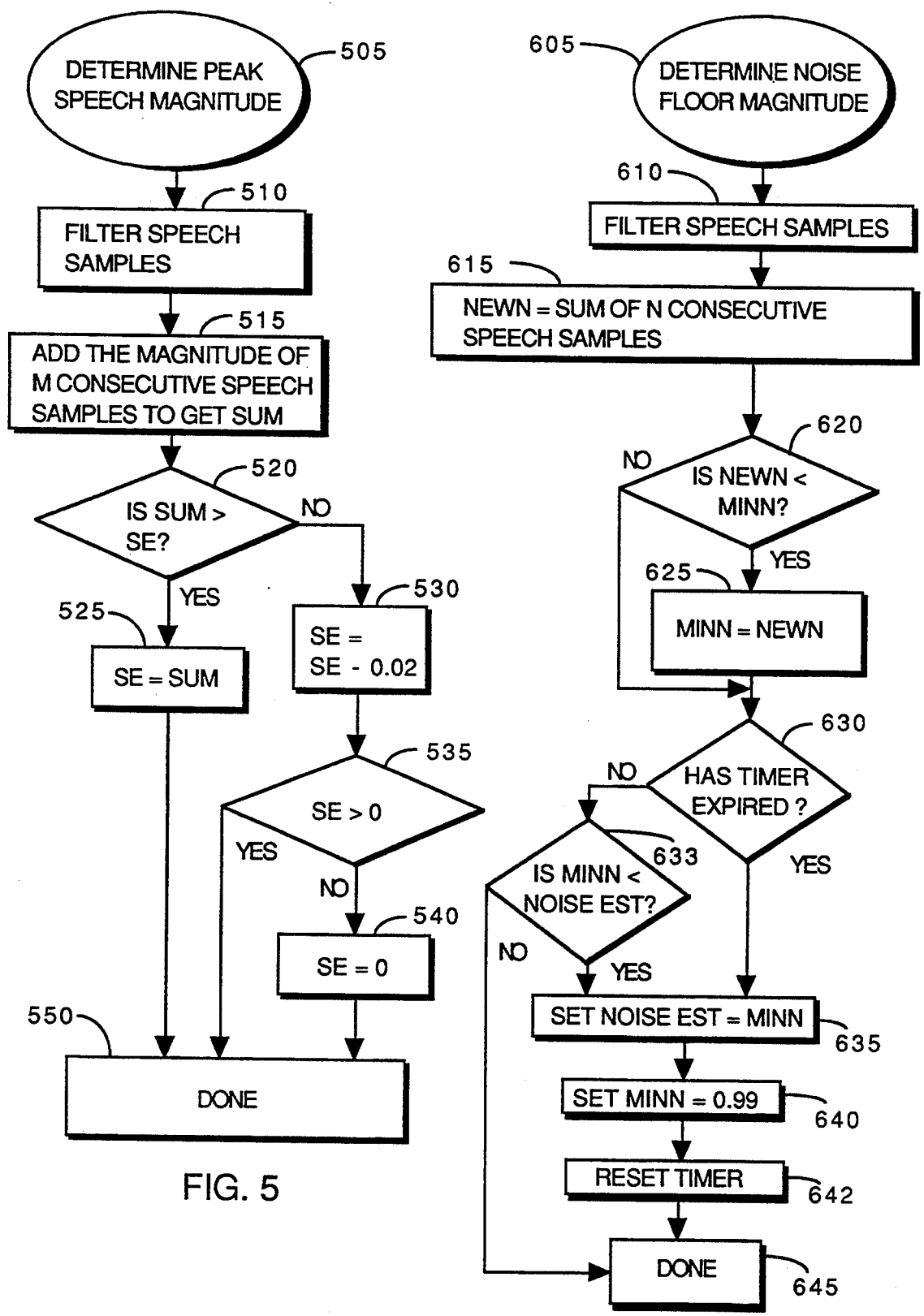
FIG. 5 is a flow diagram of a method for determining peak speech amplitude in accordance with the present invention.
FIG. 6 is flow diagram of a method for determining noise floor amplitude in accordance with the present invention.

FIG. 5 is a flow diagram of a method for determining peak speech amplitude occurring during a prescribed interval in accordance with the present invention and in correspondence to signal estimators 450, 465 of FIG. 4. A first step is to filter speech samples (block 510) to eliminate any low frequency or dc signals which may be present, analogous to the functions of filters 405 and 430 of FIG. 4.

The magnitudes (absolute values) of M many consecutive speech samples are then added to provide sum SUM (block 515). SUM is typically normalized and falls in the range from 0 to 1. In a preferred embodiment, SUM is limited to a maximum of 0.99. SUM represents a peak speech amplitude (or, alternatively, energy) over an interval of less than about 5 milliseconds, desirably between 3.5 and 1.5 milliseconds and preferably about 2.5 milliseconds.

SUM is tested to determine if SUM is greater than SE (block 520). SE represents a speech energy value determined in an earlier calculation and could be initialized, for example, to a value of zero.

If SUM is greater than SE, SE is set to the value of SUM (block 525) and control then passes to block 550. If SUM is not greater than SE, SE is set to SE-0.02 (block 530). SE is tested (block 535) to determine whether SE is greater than zero or not. If SE is greater than zero, control passes to block 550; if not, SE is set to zero (block 540) and control again passes to block 550. Current speech magnitude SUM and previous speech magnitude SE are thus determined and compared.

Steps 505 through 550 thus process signal samples to provide a peak speech energy or amplitude SUM occurring during a predetermined time interval, to compare the measured peak value to a previous value SE to determine if the peak value is increasing or decreasing during a predetermined interval and to adjust the peak speech level output variable SE.

SE is adjusted to have an increasing or constant value if the peak value is increasing or constant. If speech energy is decreasing or becomes zero, SE decreases according to a prescribed schedule (rather than decreasing abruptly). This hysteresis reduces "choppiness" in transmitted speech and maintains a regularly re-evaluated peak effective speech magnitude SE. The output from this operation is a new estimate of the peak signal strength SE representing an intelligence-carrying signal.

FIG. 6 is a flow diagram of a method for determining a representative noise value or ambient volume amplitude or energy level, also known as "noise floor", NOISE EST in accordance with the present invention and in correspondence to signal estimators 450, 465 of FIG. 4.

A first step is to filter speech samples (block 610) to eliminate low frequency or dc signals which may be present, analogous to step 510 of FIG. 5 and to filters 405 and 430 of FIG. 4. NEWN is the sum of absolute values of N consecutive speech samples (block 615). N is typically in the range from 100 to about 500, desirably about 200 to about 350 and preferably about 288, for a vocoder employing 2.5 millisecond speech frames.

NEWN is tested to determine if NEWN is less than MINN (block 620). MINN is a test value from a previous calculation.

If NEWN is less than MINN, MINN is set to the value of NEWN and control passes to block 630. If NEWN is greater than or equal to MINN, MINN is set to the value of NEWN (block 625) and control passes to block 630. A timer is checked (block 630) to determine whether or not a predetermined time interval has expired.

The predetermined time interval is in the range of a few seconds or less, desirably in the range of one half to one and a half seconds and preferably is about one second.

If the timer has expired, control passes to block 635. If the timer has not expired, control passes to block 633, where MINN is tested to determine if MINN is less than NOISE EST.

If MINN is not less than NOISE EST, control passes to block 645. If either MINN is less than NOISE EST or if the timer has expired, NOISE EST is set equal to the value of MINN (block 635), MINN is set to a value of 0.99 (block 640) and the timer is reset (block 642), with control passing to block 645.

Steps 605 through 645 process signal samples to determine a smallest signal level occurring during a predetermined interval, compare the smallest signal level found during the predetermined interval (NEWN) to a test value (MINN), selects the smaller of NEWN and MINN to compare to a previous value NOISE EST and replaces NOISE EST with the value of MINN if either a predetermined interval has passed since NOISE EST was last updated or if NOISE EST is greater than MINN. The output from these steps is a new estimate of the ambient signal strength NOISE EST present absent an intelligence-carrying signal.

NOISE EST is typically an estimate of the signal level during the quietest 10 to 50 millisecond period occurring in the last 5 seconds, desirably is an estimate of the signal level during the quietest 20 to 40 millisecond period occurring in the last half to two and a half seconds and preferably is an estimate of the signal level during the quietest 30 millisecond period occurring in the last second.

The filtering operations carried out in blocks 510, 610 of FIGS. 5 and 6 and/or in A/D converters 110, 168 of FIGS. 1 and 2 and/or in filters 405, 430 of FIG. 4 are intended to eliminate any low frequency or dc signals which may be present.

Typically, such filters have bandpass characteristics, passing signals having frequencies of greater than a lower cutoff frequency, by way of example, 100 Hertz, and attenuating signals having frequencies less than the lower cutoff frequency or having frequencies greater than an upper cutoff frequency in the range of, by way of example, 3.4 kilohertz.

Larger or smaller frequencies can be employed for either cutoff frequency without departing from the spirit and scope of the present invention. The upper cutoff frequency must be chosen such that the effective sampling rate of the analog-to-digital conversion processes employed is more than twice the highest frequency within the filter passband given by the well-known Nyquist criterion.

Figure 7:
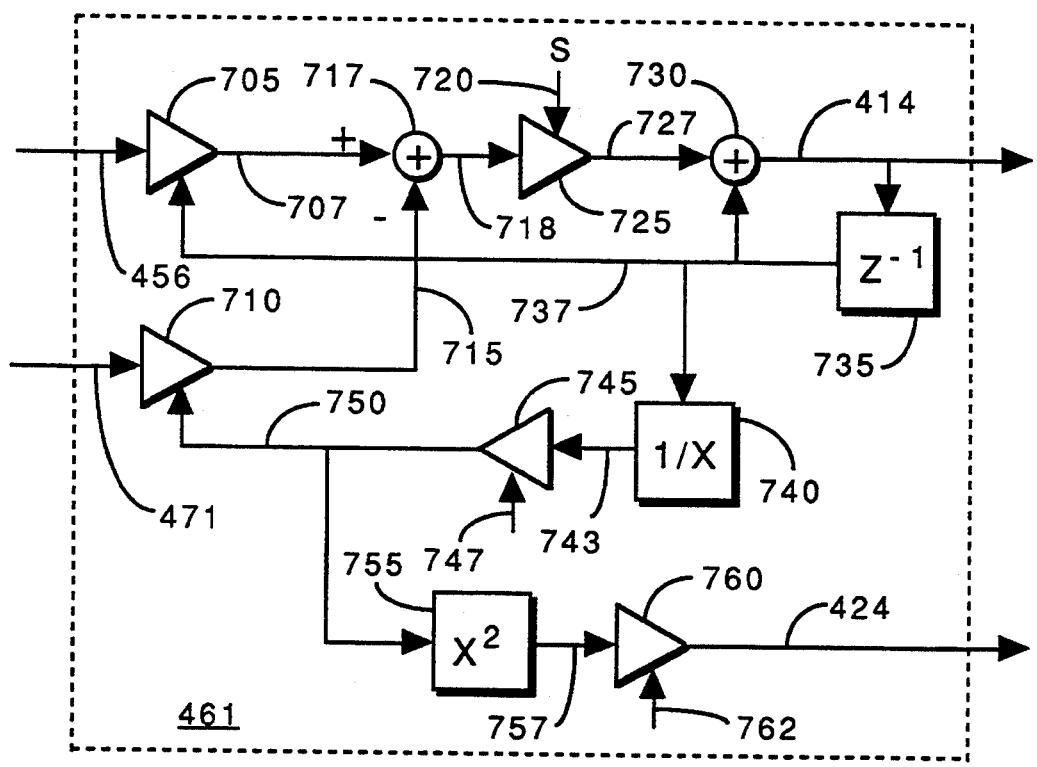
FIG. 7 is simplified block diagram of a method for gain switching in accordance with the present invention.

FIG. 7 is a simplified block diagram of gain switching method 461 in accordance with the present invention. Gain switching method 461 is represented in analog form in FIG. 7, however, it may be realized through analog or digital techniques which implement the functions represented in FIG. 7.

Gain switching method 461 is, by way of example, one method for realizing the functions of gain control module 410 of FIG. 4. Gain switching method 461 uses inputs 456 and 471 to supply estimates of ambient and peak signal levels for first and second channels CH1 and CH2 (analogous to channels CH1 and CH2 of FIGS. 1 and 2). Inputs 456 and 471 are coupled to variable gain blocks 705, 710, respectively, having outputs 707, 715, 14 respectively, and having gain adjustment inputs coupled to interconnections 737, 750, respectively.

A difference is taken between signals associated with outputs 707, 715 in adder 717 having output 718 coupled to an input of variable gain block 725. Variable gain block 725 also has gain adjustment input 720 coupled to external apparatus (not shown) and has an output coupled to interconnection 727.

Gain adjustment input 720 provides scale factor S. Scale factor S greatly influences the rate at which decay from transmit to receive occurs while having little effect on channel turn-on rates.

Scale factor S is typically in the range from 0 to 1, desirably in the range from 0.8 to 1.0 and preferably is about 0.9. Larger S values cause channel decay rates to shorten (cause more rapid channel turnaround) while smaller S values cause decay rates to lengthen (slower channel turnaround). S values below about 0.8 result in very slow channel turnaround. If channel turnaround is too slow, the party who is initially listening will have difficulty or not be able to switch to speaking.

Interconnection 727 is coupled to adder 730. Adder 730 has an output coupled to interconnection 414. Interconnection 414 provides an output signal and is also coupled to an element providing signal storage or delay of one 2.5 millisecond speech frame (block 735 having legend $Z^{-1}$).

Block 735 has an output coupled to interconnection 737, which is in turn coupled to another input to adder 730 and to an "inverter", block 740 having legend 1/X, which inverts (divides unity by) signals coupled to interconnection 737. Output signals coupled via interconnection 414 provide a gain adjustment signal to, for example, variable gain block 415 of FIG. 4 for adjusting a signal level.

Block 740 has an output coupled via interconnection 743 to variable gain block 745. Variable gain block 745 has gain adjustment input 747 and has an output coupled to interconnection 750. Interconnection 750 is coupled to the gain adjustment input of variable gain block 710 and to an input of block 755. Block 755 bearing legend $X^2$ provides the square of signals coupled via interconnection 750 and has an output coupled to interconnection 757.

Interconnection 757 is coupled to an input of variable gain block 760 having gain adjustment input 762 and an output coupled to interconnection 424. Gain adjustment input 762 is provided with a constant input signal amplitude equal to $(G_L)^{-0.5}$, where $G_L$ represents the products of the gains for both channels. Interconnection 424 provides an output signal to external apparatus such as, by way of example, variable gain block 425 of FIG. 4 for adjusting a signal level.

Figure 8:
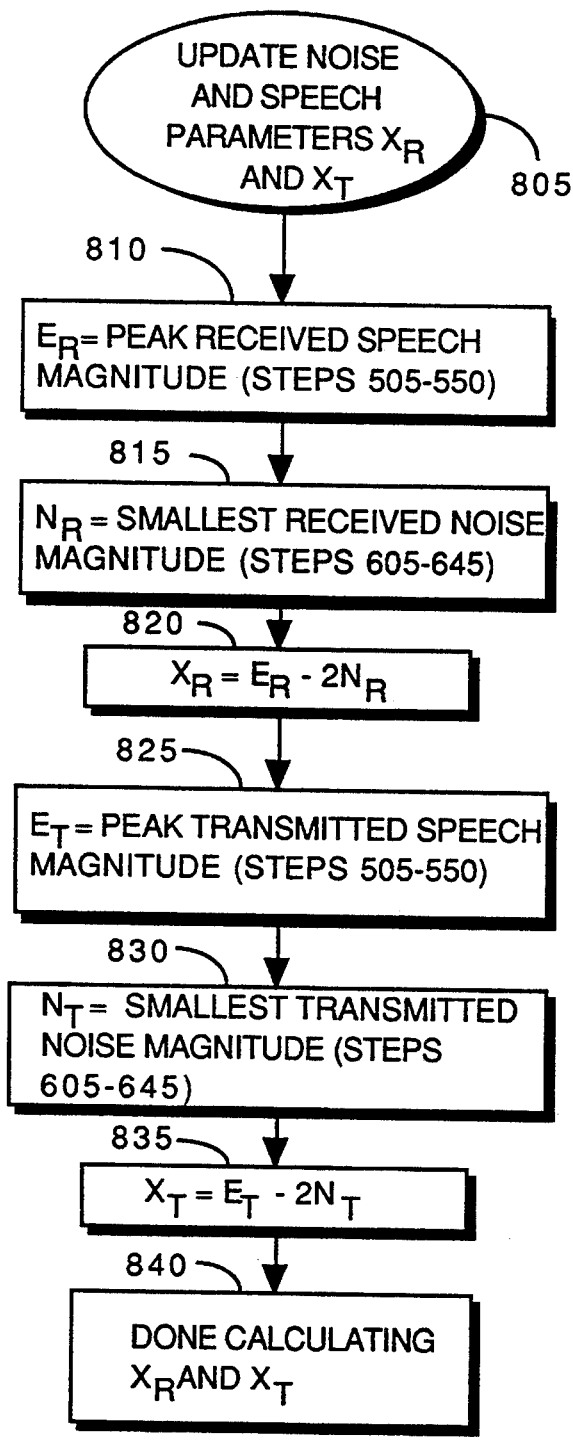
FIG. 8 is flow diagram of a method for determining differences between peak speech amplitudes and average noise amplitudes in accordance with the present invention.

FIG. 8 is a flow diagram of a method for determining differences between peak speech amplitudes and noise floor values in accordance with the present invention.

The method comprises the steps of forming peak received speech magnitude $E_R$ as described by steps 505–550 of FIG. 5 (block 810), forming smallest received noise magnitude or noise floor $N_R$ as described by steps 605–645 of FIG. 6 (block 815) and forming difference $X_R$. Difference $X_R$ is given as $E_R$ minus $2N_R$ (block 820).

Figure 9:
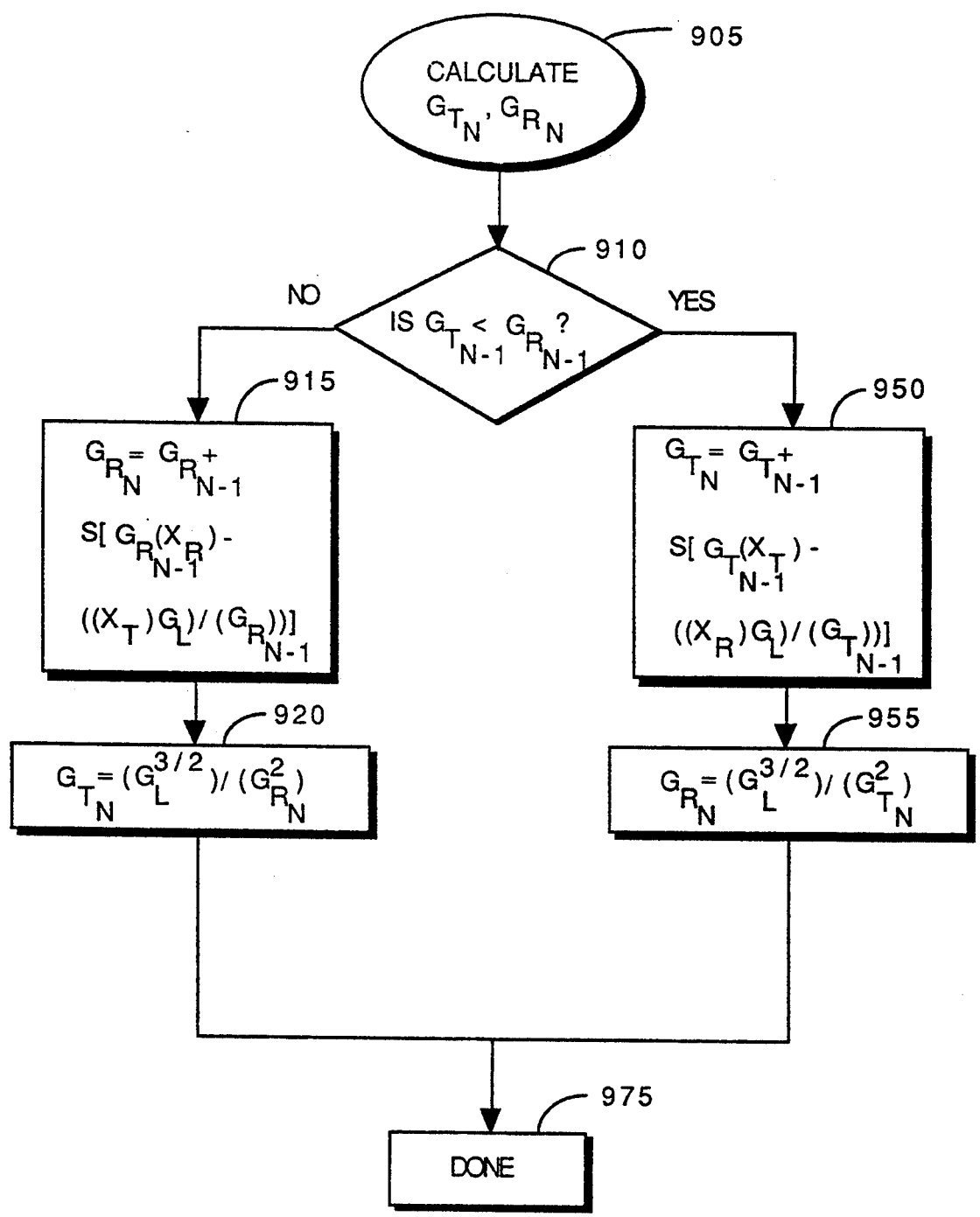
FIG. 9 is flow diagram of a method for calculating new gain parameters in accordance with the present invention.

Similarly, difference $X_T$ is formed by the steps of forming peak transmitted speech magnitude $E_T$ as described by steps 505–550 of FIG. 5 (block 825), forming smallest transmitted noise magnitude or noise floor $N_T$ as described by steps 605–645 of FIG. 6 (block 830) and forming difference $X_T$ which is given as $E_T$ minus $2N_T$ (block 835). Differences $X_R$ and $X_T$ are output for further signal processing (FIG. 9 and Eqs. 1 through 4, infra).

While two is given as a multiplier for noise estimate terms $N_R$ and $N_T$, other multipliers can be employed within the range from about one to about four, desirably within the range from one and a half to three and preferably between one and three-fourths to two and a fourth.

Use of too large a multiplier causes some speech to be clipped or blocked from transmission in response to noise while use of too small a multiplier causes the system to inadequately represent background noise, resulting in long channel turnaround times or a failure to turnaround.

The present approach is preferable to systems employing a fixed threshold because the present approach is able to account for varying levels of ambient noise and for differences in signal level from user to user or between different times or contexts for a single user.

FIG. 9 provides a flow diagram of a method for calculating new transmit and receive gain parameters $G_T$, $G_R$ in accordance with the present invention and in accordance with the arrangements depicted in FIGS. 1, 2 and 4 and the methods described in connection with FIGS. 5 through 8.

Initially, transmit gain $G_T$ and receive gain $G_R$ from the previous $((n-1)^{st})$ gain adjustment cycle are compared to determine which is larger (block 910).

When transmit gain $G_T$ is greater than receive gain $G_R$, transmit gain $G_T$ is calculated by gain generator 460 of FIG. 4 and/or steps 950, 955 of the method of FIG. 9 using output signals coupled via interconnections 455, 470 from signal estimators 450, 465 in accordance with (block 950):

$$G_{T_n} = G_{T_{n-1}} + S\{G_{T_{n-1}}(E_T - 2N_T) - (G_L/G_{T_{n-1}})(E_R - 2N_R)\}, \quad (1)$$

where subscripts n and n−1 refer to present and previous sampling intervals, respectively, subscripts T and R refer to the transmit and receive channels, respectively, $G_L$ refers to the product of the gains of these two channels, S represents a dimensionless scale factor and E and N represent speech and noise amplitudes or energies, respectively. Receive gain $G_R$ is then (block 955):

$$G_{R_n} = (G_L)^{\frac{3}{2}}(G_{T_n})^{-2}. \quad (2)$$

Similarly, when receive gain $G_R$ exceeds transmit gain $G_T$, receive channel amplitude gain $G_R$ varies in accordance with (block 915):

$$G_{R_n} = G_{R_{n-1}} + S\{G_{R_{n-1}}(E_R - 2N_R) - (G_L/G_{R_{n-1}})(E_T - 2N_T)\}, \quad (3)$$

and transmit gain $G_T$ is then (block 920):

$$G_{T_n} = (G_L)^{\frac{3}{2}}(G_{R_n})^{-2}. \quad (4)$$

The peak magnitude generator calculates the peak input signal amplitude or energy E during a sampling interval or window, which may comprise a single frame or more than one signal frames. The calculations of FIGS. 5, 6, 8 and 9 and Eqs. 1 through 4 are iteratively performed at frequency intervals.

Sampling interval width $t_w$ determines the rise time of the estimator (roughly $t_w$) and also the fall time, which is about 40 to in excess of 100 $t_w$. Fall times are a complicated function of speech levels occurring in both channels over time. Channel turn around is much more rapid when speech is present in the channel which had been listening than when both channels are quiet, for example.

Sampling interval or speech frame width $t_w$ is typically in the range of one half to three milliseconds, desirably in the range of 2.25 to 2.75 milliseconds and preferably is about 2.5 milliseconds.

If the current peak speech amplitude (or energy) is greater than $E_{R_{n-1}}$ (or $E_{T_{n-1}}$), $E_{R_n}$ (or $E_{T_n}$) takes on current peak speech amplitude (or energy) $E_R$. $E_{R_n}$ (or $E_{T_n}$) is otherwise given a value equal to the previous value $E_{R_{n-1}}$ (or $E_{T_{n-1}}$) minus a constant (FIG. 5).

Current noise parameters $N_R$ and $N_T$ are also compared to previous noise amplitudes (or energies) $N_{R_{n-1}}$ and $N_{T_{n-1}}$ and noise parameters $N_R$ and $N_T$ are updated as described in FIG. 6. This causes noise parameters $N_R$ and $N_T$ to stabilize to constant amplitudes indicative of ambient noise levels at the communication channel's transmit and receive ends.

The differences taken in Eqs. 1 and 3 (FIG. 8) represent the short term difference between the speech signal and ambient noise amplitudes and these factors provide good estimates of the speech signal strength. These factors are determined by gain generator 460 from signals present at outputs 455, 470 of signal estimators 450, 465. Gain generator 460 is designed to cause the receive gain to fall rapidly during transmit turn-on.

Loop gain $G_L$ is constant and equal to a desired "end around" loop gain when transmit gain $G_T$ is equal to receive gain $G_R$, defined as the idle state. Loop gain $G_L$ decreases when either channel becomes active in order to suppress echoes and other positive feedback effects. Transmit and receive gains $G_T$ and $G_R$ are then in accordance with Eqs. 3 and 4.

Eq. 1 shows that if receive channel speech signal amplitude $E_R$ exceeds transmit channel speech signal amplitude $E_T$, factors in the term containing S become negative and transmit gain $G_T$ begins to decrease. Transmit gain $G_T$ decreases nonlinearly with time such that rapid switching of the transmit channel to receive and vice versa, or channel turn-around, occurs. Channel turn-around is more rapid when high speech levels from a second party follow low speech levels from a first party than when low speech levels from a second party follow high speech levels from a first party.

Receive gain $G_R$ given by Eq. 4 is such that when transmit gain $G_T$ increases, receive gain $G_R$ decreases as the square of transmit gain $G_T$. This is necessary to suppress far end echoes which otherwise result from long time delays through, for example, telephone lines, microwave links, cables and/or vocoder and/or other speech processor delays.

Following either transmit gain $G_T$ or receive gain $G_R$ computation (block 920 or 955), control passes to block 975. Steps 905 through 975 thus allow transmit and receive gains $G_T$, $G_R$ to be determined and implemented, permitting channel switching and so facilitating communication without echoes, system oscillation or other unwanted feedback effects.

A/D and D/A converters 110, 165 and 120, 155 of FIGS. 1 and 2 are conveniently realized as Type TLC32044 analog-to-digital converter integrated circuits available from Texas Instruments of Dallas, Tex., or alternatively as Type T7525 digital-to-analog integrated circuits available from American Telephone and Telegraph (AT&T) of N.J. These A/D and D/A converters include anti-aliasing filters.

Processors 115 and 160 of FIG. 1 and 215, 220, 260 and 265 of FIG. 2 are conveniently realized as Type DSP 56001 digital signal processor integrated circuits available from Motorola of Phoenix, Ariz.

Such a speakerphone system may be realized through extensive modification of, for example, a STU-III TM secure telephone unit manufactured by Motorola, Inc. of Scottsdale, Ariz.

Software written in a programming language appropriate to the Type DSP 56001 digital signal processor integrated circuit is included in Appendix A. This code implements functions depicted in FIGS. 1, 2, 4 and 7 and flowcharted in FIGS. 5, 6, 8 and 9.

This approach to channel switching in a speakerphone eliminates separate components ordinarily required in order to interface telephones to telephone systems and to switch between the transmit and receive states.

The method and apparatus described herein require few computations and little memory within the DSP integrated circuits and so do not detract appreciably from the DSPs performance of other signal processing tasks. Performing these functions via digital rather than analog techniques eliminates temporal and/or thermal performance degradation which analog circuits exhibit as such circuits age and component values correspondingly shift from nominal or original values.

Thus, a channel switching method and apparatus for emulating half duplex operation over full-duplex communication channels have been described which overcome specific problems and accomplish certain advantages relative to prior art methods and mechanisms. The improvements over known technology are significant.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for adjusting a signal level, said method comprising steps of:
   providing a first input signal;
   providing a second input signal;
   determining first and second minimum signal levels of the first and second input signals;
   determining first and second peak signal levels of the first and second input signals;
   processing the first and second minimum signal levels and the first and second peak signal levels to provide a first control signal and a second control signal, the first and second control signals being continuously variable over a range and varying contrarily to one another;
   adjusting a first output signal level in accordance with the first control signal; and
   adjusting a second output signal level in accordance with the second control signal;
   wherein said first and second adjusting steps cause either the first output signal or the second output signal to be attenuated and cause either the second output signal or the first output signal to not be attenuated.

2. A method as, claimed in claim 1, wherein:
   said first providing step includes a step of filtering the first input signal; and
   said second providing step includes a step of filtering the second input signal.

3. A method as claimed in claim 1, wherein said determining, processing and adjusting steps are performed by a processor.

4. A method as claimed in claim 2, wherein said first and second filtering steps each comprise a step of blocking direct current signals to allow only signals having a frequency of greater than approximately one hundred Hertz to pass.

5. A method as claimed in claim 1, wherein said determining steps comprise steps of:
   measuring a first peak signal level of the first input signal over a first time interval;
   measuring a first minimum signal level of the first input signal over a second time interval;
   measuring a first peak signal level of the second input signal over the first time interval; and
   measuring a first minimum signal level of the second input signal over the second time interval.

6. A method as claimed in claim 5, wherein said second time interval comprises a series of intervals in a range of approximately ten to 50 milliseconds, concatenated to comprise an interval of less than five seconds in duration.

7. An apparatus, comprising:
   a first audio input for providing first audio input signals;
   a second audio input for providing second audio input signals;
   a processor coupled to said first audio input and to said second audio input, said processor including a memory, said processor for estimating a peak level and a minimum level of each of said first and second audio input signals;
   a first signal regulator coupled to said first audio input and to a first audio output, said first signal regulator for providing first audio output signals from said first audio input signals;
   a second signal regulator coupled to said second audio input and to a second audio output, said second signal regulator for providing second audio output signals from said second audio input signals; and
   a gain adjustment apparatus coupled to said processor and to said first and second signal regulators, said gain adjustment apparatus for providing control signals to said first and second signal regulators to adjust an output signal level of said first audio output signals in response to said minimum and peak levels of said first and second audio input signals, wherein said first output signal levels are continuously variable over a range.

8. An apparatus as claimed in claim 7, wherein said processor further is for determining a lower level of said first audio input signals over a short time interval and comparing lower levels of said first audio input signals from a series of short time intervals for determining said minimum level occurring within said series of short time intervals.

9. An apparatus as claimed in claim 8, wherein said short time interval comprises a time interval in a range of from 20 to 40 milliseconds.

10. An apparatus as claimed in claim 8, wherein said series of short time intervals comprise an interval in a range of from one-half to 3 seconds.

11. An apparatus as claimed in claim 7, wherein said processor comprises a digital signal processor.

12. An apparatus as claimed in claim 7, wherein said processor comprises an analog signal processor.

13. An apparatus as claimed in claim 7, wherein said first audio input further includes:
   a first filter coupled to said first audio input, said first filter for conditioning first audio input signals from said first audio input; and
   a first analog to digital conversion circuit coupled to said first filter and to said processor, said first analog to digital conversion circuit for converting said first audio input signals from analog signals to digital signals.

14. An apparatus as claimed in claim 7 wherein said second audio input further includes:
   a second filter coupled to said second audio input, said second filter for conditioning second audio input signals from said second audio input; and
   a second analog to digital conversion circuit coupled to said second filter and to said processor, said second analog to digital conversion circuit for converting said first audio input signals from analog signals to digital signals.

15. An apparatus as claimed in claim 8, wherein said short time interval comprises a time interval of approximately 30 milliseconds.

16. A full duplex signal communications channel including signal processing apparatus, said signal processing apparatus comprising:
- a first input for providing a first signal;
- a second input for providing a second signal;
- a processor coupled to said first and second inputs, said processor for estimating an peak level and a minimum level of each of said first and second input signals during discrete time intervals;
- a first signal level regulator coupled to said first input and to a first output, said first signal level regulator for delivering a first output signal having a first gain $G_T$ from said first input signal;
- a second signal level regulator coupled to said second input and to a second output, said second signal level regulator for delivering a second output signal having a second gain $G_R$ from said second input signals; and
- a gain adjuster coupled to said processor and to said first and second signal level regulators, said gain adjuster for providing control signals to said first and second signal level regulators to adjust first and second output signal levels of said first and second output signals in response to said minimum and peak levels of said first and second input signals, wherein said first and second output signal levels are continuously variable over a range, wherein said first and second signal regulators provide said second gain $G_R$ according to:

$$G_{Rn} = (G_L)^{\frac{3}{2}}(G_{Tn})^{-2}.$$

17. A signal processing apparatus as claimed in claim 16, wherein said first and second signal regulators provide said first gain $G_T$ according to:

$$G_{Tn} = G_{Tn-1} + S\{G_{Tn-1}(E_T - 2N_T) - (G_L/G_{Tn-1})(E_R - 2N_R)\},$$

wherein subscripts n and n−1 refer to present and previous discrete time intervals, respectively, subscripts T and R refer to said first and second signal regulators, respectively, $G_L$ refers to a product of said first gain of said first signal regulator and said second gain of said second signal regulator during previous discrete time interval n−1, S represents a dimensionless scale factor, E represents peak speech amplitudes, N represents minimum speech amplitudes.

18. A signal processing apparatus as claimed in claim 16, comprising:
- a first digital to analog converter circuit coupled to said first signal level regulator, said first digital to analog converter circuit for providing said first output signal; and
- a second digital to analog converter circuit coupled to said second signal level regulator, said second digital to analog converter circuit for providing said second output signal.

19. A signal processing apparatus as claimed in claim 18, wherein said processor, said first and second signal level regulators and said gain adjustment device comprise digital circuitry.

20. A signal processing apparatus as claimed in claim 16, wherein:
- said first signal input includes a first analog to digital converter, said first analog to digital converter for converting said first input signal from analog to digital; and
- said second signal input includes a second analog to digital converter, said second analog to digital converter for converting said second input signal from analog to digital.

* * * * *